(12) United States Patent
Tegen et al.

(10) Patent No.: US 12,107,152 B2
(45) Date of Patent: Oct. 1, 2024

(54) SEMICONDUCTOR DIE WITH A POWER DEVICE AND METHOD OF MANUFACTURING THE SAME

(71) Applicant: Infineon Technologies Dresden GmbH & Co. KG, Dresden (DE)

(72) Inventors: Stefan Tegen, Dresden (DE); Alessandro Ferrara, Landskron (AT); Adrian Finney, Villach (AT); Matthias Kroenke, Dresden (DE); Christoph Kubasch, Dresden (DE); Rolf Weis, Dresden (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 403 days.

(21) Appl. No.: 17/682,113

(22) Filed: Feb. 28, 2022

(65) Prior Publication Data

US 2022/0285532 A1    Sep. 8, 2022

(30) Foreign Application Priority Data

Mar. 3, 2021  (EP) .................................. 21160496

(51) Int. Cl.
| | |
|---|---|
| *H01L 29/66* | (2006.01) |
| *H01L 27/02* | (2006.01) |
| *H01L 27/06* | (2006.01) |
| *H01L 29/423* | (2006.01) |

(Continued)

(52) U.S. Cl.
CPC .... *H01L 29/66734* (2013.01); *H01L 27/0255* (2013.01); *H01L 27/0629* (2013.01); *H01L 29/4236* (2013.01); *H01L 29/7808* (2013.01); *H01L 29/866* (2013.01)

(58) Field of Classification Search
CPC ........... H01L 29/66734; H01L 27/0255; H01L 27/0629; H01L 29/4236; H01L 29/7808; H01L 29/866; H01L 29/407; H01L 29/7803; H01L 29/7813; H01L 29/0684; H01L 29/404; H01L 29/66666; H01L 29/7827; H01L 29/0607
See application file for complete search history.

(56) References Cited

U.S. PATENT DOCUMENTS

| | | |
|---|---|---|
| 2007/0138544 A1 | 6/2007 | Hirler et al. |
| 2013/0056790 A1 | 3/2013 | Kawamura |

(Continued)

FOREIGN PATENT DOCUMENTS

EP    3624201 A1    3/2020

*Primary Examiner* — J. E. Schoenholtz
(74) *Attorney, Agent, or Firm* — Murphy, Bilak & Homiller, PLLC

(57) ABSTRACT

The disclosure relates to a semiconductor die with a transistor device, which has a channel region formed in a semiconductor body, a gate region aside the channel region, for controlling a channel formation, a drift region formed in the semiconductor body, and a field electrode in a field electrode trench, which extends from a frontside of the semiconductor body vertically into the drift region, wherein an insulating layer is formed on the frontside of the semiconductor body and a frontside metallization is formed on the insulating layer, and wherein a capacitor electrode is formed in the insulating layer, which is conductively connected to at least a portion of the field electrode.

14 Claims, 6 Drawing Sheets

(51) Int. Cl.
*H01L 29/78* (2006.01)
*H01L 29/866* (2006.01)

(56) References Cited

U.S. PATENT DOCUMENTS

| | | | |
|---|---|---|---|
| 2014/0264573 A1* | 9/2014 | Kocon | H01L 21/6835 |
| | | | 257/330 |
| 2017/0236934 A1* | 8/2017 | Rankila | H01L 29/7813 |
| | | | 438/468 |
| 2019/0341339 A1 | 11/2019 | Fujita et al. | |

* cited by examiner

SEMICONDUCTOR DIE WITH A POWER DEVICE AND METHOD OF MANUFACTURING THE SAME

TECHNICAL FIELD

The present disclosure relates to a semiconductor die with a power device comprising a channel region and a gate region.

BACKGROUND

The gate region of the power device is formed aside the channel region, it comprises a gate dielectric and a gate electrode. The gate dielectric is arranged in between the channel region and the gate electrode, capacitively coupling the latter to the channel region. Vertically below the channel region, a drift region is formed in the semiconductor body, a field electrode trench extending into the latter. In this field electrode trench, a field electrode is arranged, capacitively coupling to the drift region.

SUMMARY

It is an object of the present application to provide a semiconductor die with a power device having improved characteristics, as well as a method of manufacturing such a device.

The die comprises a capacitor electrode, which is formed in an insulating layer arranged on a frontside of the semiconductor body. This capacitor electrode is conductively connected to at least a portion of the field electrode formed in the trench, which can for instance allow for an adaption of the electrical capacity between the field electrode and the source region or a frontside metallization formed on the insulating layer. Compared to a capacitor added externally to the die, the integration can give a robust solution and allow for a scalability.

Particular embodiments and features are presented throughout this disclosure. Thereby, the individual features shall be disclosed independently of a specific claim category, the disclosure relates to apparatus and device aspects, but also to method and use aspects. If for instance a device manufactured in a specific way is described, this is also a disclosure of a respective manufacturing process, and vice versa. In general words, an approach of this application is to form an additional capacitor electrode integrally in the semiconductor die, e.g. integrated into an insulating layer on the semiconductor body.

The "insulating layer" can be a single layer or a stack formed of a plurality insulating sublayers. The capacitor electrode "formed in the insulating layer" can for instance be arranged in a recess or an interruption of the insulating layer. It can be embedded into the insulating layer, e.g. be arranged vertically between two sublayers of the insulating layer and/or be contained with respect to the lateral direction. A sublayer can for instance cover basically the whole the semiconductor body, e.g. be only interrupted by vertical interconnects, or it can have a comparably small lateral extension, e.g. be only arranged below or above the capacitor electrode (see the dielectric spacer discussed below). The insulating layer or sublayer can for instance be a silicon nitride, silicon oxide or borophosphosilicate glass (BPSG) layer or sublayer; a sublayer stack can for instance comprise silicon nitride and/or silicon oxide formed on the semiconductor body, e.g. combined with BPSG covering the capacitor electrode.

The gate region, which comprises the gate dielectric and the gate electrode, can particularly be formed laterally aside the channel region, e.g. in a trench. In particular, the gate electrode can be arranged in the field electrode trench, namely vertically above the field electrode, e.g. electrically isolated therefrom by an insulating layer. In a lateral direction, the field electrode trench can have a longitudinal extension, it can for instance form a grid-like or in particular stripe-like pattern together with other respective trenches, when seen in a top view. Between two neighboring trenches, the drift region can in particular have a continuous extension, so that for instance no further compensation structure is formed there.

Generally, when reference to a "vertical cross-section" is made, the cross-sectional plane lies parallel to the vertical direction. The sectional plane can intersect the trench perpendicularly to its longitudinal extension in a lateral direction, e.g. lie perpendicular to the stripes of an aforementioned stripe-design. Generally, the "vertical direction" lies perpendicular to a surface of the device, for instance a surface of the semiconductor body or of a frontside metallization.

Referring to a source and a drain region of a first conductivity type, the channel region can be formed in a body region of a second conductivity type opposite to the first conductivity type. In particular, the source region can be formed at a frontside of the device and the drain region at a backside thereof, the channel region and the drift region arranged vertically between, e.g. the drift region between the channel region and the drain region. The drift region can be of the first conductivity type as well, wherein its dopant concentration is lower compared to the drain region. By way of example, the first type can be n-type and the second type one p-type. As a power device, such a transistor can for instance have a breakdown voltage of at least 10 V, 20 V, 30 V, 40 V or 50 V, possible upper limits being for example not more than 800 V, 600 V, 400 V or 200 V.

In an embodiment, the field electrode formed in the trench comprises a first and a second field electrode structure, the former capacitively coupling to a first section of the drift region and the latter coupling to a second section. The second section is arranged vertically above the first section, namely at a smaller vertical depth/smaller distance from the frontside of the semiconductor body. The stacking of the field electrode structures in the field electrode trench can allow for an integration of a series of low-voltage geometries which together support a higher voltage. In consequence, the $R_{on} \cdot A$ can for instance be decoupled from the breakdown voltage, the stacked field electrode structures allowing for an $R_{on} \cdot A$ reduction while maintaining a certain breakdown voltage.

A biasing of the field electrode structures to a required voltage, e.g. to $V_{DS}/2$ in case of two stacked field electrode structures, can for instance be achieved with a capacitive potential divider. E.g. during faster switching, the capacitors will bias the field electrode structures due to the current flowing through them. This can for instance require the capacity between the field electrode structures to be adjusted to basically the same value as the capacity between the first or lowermost field electrode structure and the drain region. However, since the lateral overlap between the field electrode structures can be comparably small, the capacity between the field electrode structures can be too small, e.g. amount to only 20% of the capacity between the first field electrode structure, which is in particular the lowermost field electrode structure, and the drain region.

With the capacitor electrode, the capacity or capacities can be adjusted such that a predefined potential difference sets between the field electrode structures, in particular in dynamic operation (with an additional resistor, RC coupling can be achieved, see below). Even though reference is primarily made to the first and the second field electrode structure, more than two field electrode structures can be stacked in the trench, namely at least three field electrode structures, possible upper limits being for instance not more than ten, eight, six or four field electrode structures. Independently of the number of field electrode structures stacked and/or of whether the gate electrode is arranged in the trench, the field electrode is electrically isolated from the drift region by a field dielectric. This field dielectric can in particular electrically isolate the lowermost field electrode structure in the trench from the drift region and also from the drain region.

In an embodiment, the capacitor electrode formed in the insulating layer is conductively connected to the first field electrode structure. This can for instance increase the capacity between the first field electrode structure and the source potential, e.g. via the capacitive coupling between the capacitor electrode and the frontside metallization and/or between the capacitor electrode and a vertical interconnect contacting the source region. Assuming that the second field electrode structure is conductively connected to the source region, the additional capacitance added between the first field electrode structure and the source potential increases also the capacity between the field electrode structures. In general words, the capacitor electrode can form a capacitor connected in parallel with the first field electrode structure.

In an embodiment, a capacity value between the first field electrode structure and the source potential is set to basically correspond to the capacity between the first field electrode structure and the drain potential, in particular to the capacity between the first field electrode structure and a backside metallization. "Basically" can for instance mean a deviation of not more than 20%, 10% or 5%.

As mentioned already, more than two field electrode structures can be stacked on each other in the field electrode trench. For the purpose of illustration, a 120 V device can for instance be fabricated from two 60 V devices stacked on each other, but it could also be fabricated from three 40 V devices stacked on each other, the latter resulting in an even lower $R_{on} \cdot A$. In general words, in case of n field electrode structures stacked on each other in the trench, a target can be to bias each field electrode structure to $V_{DS}/n$.

In an embodiment, the capacitor electrode is, seen in a vertical cross-section, arranged vertically above the gate electrode. Vertically between, a lower dielectric spacer can be arranged. The gate electrode can in particular be embedded into the semiconductor body, e.g. be formed in the same trench-like the field electrode, namely in the field electrode trench.

In an embodiment, the capacitor electrode capacitively couples to a vertical interconnect, see the remarks above. The vertical interconnect can conductively connect the frontside metallization formed on the insulating layer to the source region of the device, the capacitor electrode increasing the coupling to the source potential, e.g. of the first field electrode structure. The vertical interconnect can in particular be made of metal, e.g. as a tungsten interconnect. Independently of the specific material, a lateral distance between the capacitor electrode and the vertical interconnect can for instance be at least 100 nm or 200 nm, possible upper limits being for instance not more than 1 μm, 0.7 μm or 0.5 μm.

In an embodiment, an upper dielectric spacer is arranged vertically between the frontside metallization and the capacitor electrode, which capacitively couples the latter to the frontside metallization. Regarding possible materials, reference is made to the insulating layer or sublayer materials discussed above, the upper dielectric spacer can in particular be made of BPSG. Independently of the material chosen, a frontside, namely upper side, of the upper dielectric spacer can for instance lie flush with a frontside of the insulating layer laterally aside the capacitor electrode. The upper dielectric spacer can for example have a vertical thickness of at least 100 nm or 200 nm, possible upper limits being for instance not more than 2 μm, 1 μm or 0.6 μm (the same values shall be disclosed for the lower dielectric spacer discussed below).

In an embodiment, the field electrode and the trench have a longitudinal extension in a first lateral direction (see the remarks above), and also the capacitor electrode has a longitudinal extension in this direction. The field electrode and the capacitor electrode can in particular extend in parallel to each other across the die. In the first lateral direction, the capacitor electrode and/or field electrode can for instance have a length which is at least 10 times, 20 times or 30 times as large as its width taken in a second lateral direction perpendicular to the first lateral direction (possible upper limits will depend from the die and device size, by way of example not more than 10,000 times or 1,000 times can be mentioned).

In an embodiment, the die comprises a plurality power devices arranged consecutive in a second lateral direction, in particular a plurality transistor devices. These can be connected in parallel and act or be operated as one transistor made of a plurality transistor cells. Seen in a vertical cross-section, the sectional plane lying parallel to the second lateral direction, the capacitor electrodes of the consecutive devices can in particular be separated from each other by a respective portion of the insulating layer. In other words, the capacitor electrode does not extend as a continuous plate across the consecutive devices, instead it is interrupted in a respective intermediate section laterally in between two devices. In such an intermediate section, the insulating layer can extend continuously between the two neighboring capacitor electrodes or, in particular, can be interrupted by a vertical interconnect, e.g. a source contact.

In an embodiment, a second insulating layer formed on the semiconductor body in an edge region of the die differs from the insulating layer comprising the capacitor electrode, e.g. in a layer thickness and/or the layer material. In particular the upper dielectric spacer formed between the capacitor electrode and the frontside metallization can be made of a different material than the second insulating layer. The latter can for instance comprise or consist of BPSG, wherein the upper dielectric spacer can be chosen in dependence of the dielectric properties required for the capacitor formed with the frontside metallization. Alternatively or in addition, the portion of the insulating layer arranged laterally between the capacitor electrode and a vertical interconnect (see above), can be made of another material than the second insulating layer in the edge region.

Alternatively or in addition to the use of different materials, at least for a respective sublayer or for the insulating layer as a whole, the insulating layers can have a different vertical thickness, e.g. have a greater thickness above the device than in the edge region. The thickness can for example be increased by an additional layer, e.g. a silane layer. Generally, the edge region can for instance extend laterally between a lateral edge of the die and the active region in which the power device or devices is/are formed.

In an embodiment, a resistor is connected in parallel with a capacitor formed by the field electrode and/or the capacitor electrode, in particular a resistor integrated into the die. If for instance a first and a second field electrode structure are stacked, a resistor can be connected in parallel with the capacitor formed between the field electrode structures and/or a resistor can be connected in parallel with the capacitor formed by the lowermost (e.g. first) field electrode structure and the drain potential. In general words, if a chain of capacitors is formed, a respective resistor can be connected in parallel with each of the capacitors, wherein these capacitor/resistor pairs can be connected in series. With this RC-coupling, the desired voltage drop can be achieved during static or slow switching operation (resistive voltage divider) and during faster switching (capacitive potential divider).

A resistor can for example be formed by a chain of diodes. For that purpose, e.g. alternating regions of the first and second conductivity type can be formed in the semiconductor body, the alternating regions arranged for example consecutive in a lateral direction. With the regions formed directly adjacent, first and second type junctions are formed alternatingly, e.g. alternating pn- and np-junctions. In particular, every second junction can be bridged, e.g. short-circuited by a conductive element, for instance polysilicon or in particular metal. The conductive element can for instance bridge the junction over a vertical length, e.g. be arranged in a trench or contact hole structure, or bridge them over a lateral length, e.g. be placed on top. The diodes formed by bridging every second junction can for instance be connected or operated in forward direction, where e.g. every np-junction is shortened.

When a respective resistor formed of a chain of diodes is connected in parallel to a capacitor formed by the field electrode and/or the capacitor electrode, at least one bridged junction is connected in parallel to the respective capacitor, in particular at least two, three or four bridged junctions, possible upper limits being for instance not more than 20, 15 or 10 bridged junctions (in parallel to a single capacitor).

In an embodiment, a chain of diodes forming a resistor, e.g. with every second junction bridged or connected as Z-diodes, is connected in parallel with a first capacitor formed by the first field electrode structure and a drain potential (e.g. drain region and/or backside metallization) and/or a chain of diodes forming a resistor (bridged junctions or Z-diodes) is connected in parallel with a second capacitor formed by the second field electrode structure and the frontside metallization. "Z-diode" relates to an avalanche diode, e.g. a "Zener-diode". The Z-diodes can for example act as a resistor with a comparably low leakage current and can be combined with an additional capacitor, e.g. formed by the capacitor electrode. A respective Z-diode can have a comparably small lateral width, e.g. of not more than 3 μm or 2.5 e.g. around 2 μm (possible lower limits being for instance 1 μm or 1.5 μm).

Using a chain of diodes as a resistor can also allow for a certain adaption of the capacities, because the diodes can have built-in capacities. In consequence, the integrated capacitance of the diode chain can be used to reduce or balance the aforementioned capacity mismatch (between the field electrode structures among each other compared to the capacity formed with the drain potential). The embodiment "chain of diodes connected in parallel to the capacitor formed by a field electrode structure" shall also be disclosed independently of whether a capacitor electrode is integrated into the insulating layer or not. The diode chain can be used for charging and discharging the capacitor and, in addition, for balancing the capacitance mismatch, it can in particular be made of alternating regions and bridging conductive elements, see above.

Independently of the specific device, the method for manufacturing a die with a capacitor electrode comprises forming the insulating layer on the frontside of the semiconductor body; forming the capacitor electrode.

Here, a different sequence of the steps is possible. For instance, a stack of a lower dielectric material sublayer covered by a capacitor electrode material can be deposited first and structured subsequently to define the capacitor electrode or electrodes, e.g. above the trench or trenches, and remove the capacitor electrode material laterally in between. The lower dielectric material can for instance comprise silicon nitride and/or silicon oxide sublayer, e.g. TEOS; in particular, a silicon nitride layer can be deposited onto the frontside of the semiconductor body and can be covered by a silicon oxide layer. The capacitor electrode material can also be removed in an edge region of the die. Subsequently, a further sublayer of the insulating layer can be formed by depositing an upper dielectric material, e.g. to form the dielectric spacer above the capacitor electrode or electrodes.

In an at least in part alternative method of manufacturing, the insulating layer material embedding the capacitor electrode laterally in the ready-made die can be deposited prior to the deposition of the capacitor electrode material. In this case, after the sublayer or layers of the insulating layer, which embed the capacitor electrode laterally later on, have been deposited, a recess can be etched into this or these layer(s). Subsequently, the capacitor electrode material can be deposited into the recess, e.g. after depositing a sublayer of insulating material to define a lower dielectric spacer. To cover the capacitor electrode and form the upper dielectric spacer, insulating layer material can be deposited after the capacitor electrode material deposition, in particular after a removal of excess capacitor electrode material, e.g. from a frontside, for instance by chemical mechanical polishing (CMP), and/or after an etchback step to adjust the height of the capacitor electrode in the recess.

Independently of the sequence, the insulating layer material deposited to form the upper dielectric spacer can for instance be BPSG or, in case that other dielectric properties are required, another material can be chosen, for instance silicon oxide, e.g. TEOS. After forming and embedding the capacitor electrode into the insulating layer, a contact hole or holes can be etched, intersecting the layer completely to form the vertical interconnects. If for instance a lower or lowermost sublayer is made of silicon nitride, the etch chemistry can be adapted to etch into the latter and, subsequently, into the semiconductor body. Then, the vertical interconnect can be formed e.g. by depositing tungsten, in particular after a titanium or titanium nitride deposition to form titanium silicide.

BRIEF DESCRIPTION OF THE DRAWINGS

Below, the die with the power device and the manufacturing of the same are explained in further detail by means of exemplary embodiments. Therein, the individual features can also be relevant in a different combination.

DETAILED DESCRIPTION

Figure 1:
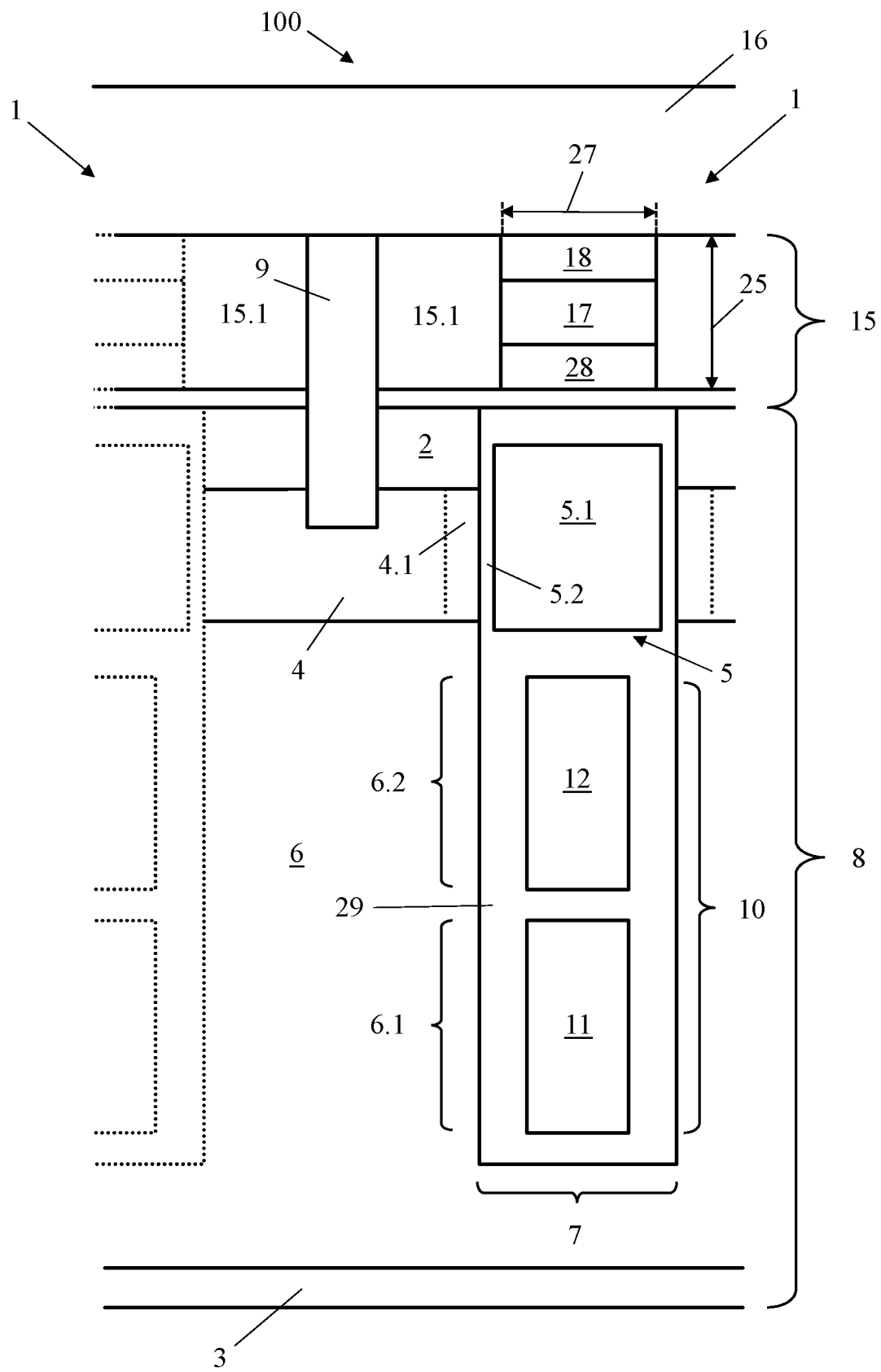
FIG. 1 shows a power device in a semiconductor die in a cross-sectional view.

FIG. 1 shows a power device 1 having a source region 2 and a drain region 3, wherein a body region 4 and a drift region 6 are formed vertically in between. In the example shown, the body region 4 is p-doped, whereas the source region 2, the drain region 3 and the drift region 6 are n-doped, the drift region 6 with a lower doping concentration than the drain region 3. Moreover, the device 1 comprises a gate region 5 formed aside a channel region 4.1 of the body region 4. The gate region 5 comprises a gate electrode 5.1 and a gate dielectric 5.2, which capacitively couples the gate electrode 5.1 to the channel region 4.1. By applying a voltage to the gate electrode 5.1, a channel formation and, in consequence, vertical current flow through the channel region 4.1 can be controlled.

In addition, the device 1 comprises a field electrode 10 which is formed in a field electrode trench 7 extending into the drift region 6. In the example shown, the gate electrode 5.1 is arranged above the field electrode 10 in the field electrode trench 7. The field electrode comprises a first field electrode structure 11 and a second field electrode structure 12 formed above. In the example shown, the first field electrode structure 11 is the lowermost one and the second field electrode structure 12 is the uppermost one, even though more than two field electrode structures 11, 12 can be stacked on each other.

Via a field dielectric 29, the first field electrode structure 11 capacitively couples to a first section 6.1 of the drift region 6, and the second field electrode structure 12 capacitively couples to a second section 6.2 of the drift region 6. As discussed in the general description in detail, the stacked field electrode structures 11, 12 can allow for a serial integration of lower voltage geometries, e.g. 60 V, which together support a higher voltage, e.g. 2×60 V in this example.

Due to the comparably small horizontal overlap between the first and the second field electrode structure 11, 12, the capacity between the two field electrode structures 11, 12 is smaller than the capacity between the first field electrode structure 11 and the drain potential (e.g. only around 20% thereof). To realize a capacitive voltage divider with basically the same capacities, a capacitor electrode 17 is provided. It is embedded into an insulating layer 15 which is formed on the semiconductor body 8. On the insulating layer 15, a frontside metallization 16 is formed, for instance an aluminum metallization, e.g. AlCu. A vertical interconnect 9 extends through the insulating layer 15, for example a tungsten contact, electrically connecting the frontside metallization 16 to the source region 2 (and to the body region 4). On the left, a further device 1 is formed, which is only shown schematically. The capacitor electrodes 17 of the different devices 1 are separated from each other by portions 15.1 of the insulating layer 15.

Via an upper dielectric spacer 18, e.g. made of BPSG or TEOS, the capacitor electrode 17 capacitively couples to the frontside metallization 16. Moreover, it capacitively couples to the vertical interconnect 12, which is on source potential like the frontside metallization 16. By conductively connecting the first field electrode structure 11 to the capacitor electrode 17 (see FIG. 3 for illustration), the capacity between the first field electrode structure 11 and the source potential can be increased. With this, additional capacity is added between the field electrode structures 11, 12, when the second field electrode structure 12 is conductively connected to the source potential. In consequence, the capacitor electrode 17 allows for an adjustment or balancing of the capacities formed by the field electrode structures 11, 12, e.g. to arrive at a capacitive voltage divider defining basically the same voltage drop for the field electrode structures 11, 12 (under dynamic switching).

Figure 2:
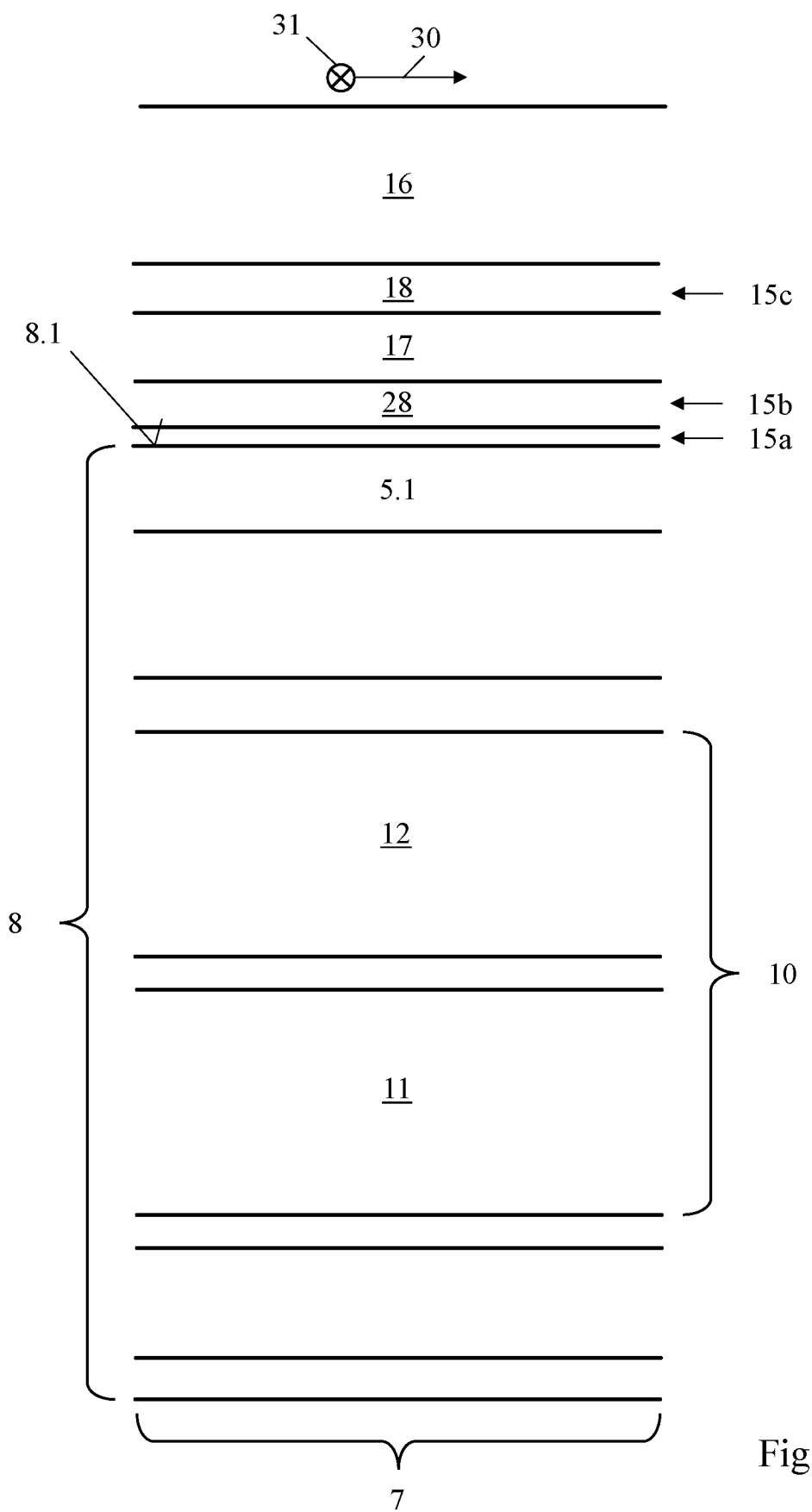
FIG. 2 illustrates the device of FIG. 1 in another cross-sectional plane, perpendicular to the drawing plane of FIG. 1.

FIG. 2 illustrates a further vertical cross-section, the sectional plane lying perpendicular to the drawing plane of FIG. 1. The sectional plane of FIG. 2 lies parallel to a first lateral direction 30 in which the field electrode trench 7, the field electrode 10, the gate electrode 5.1, and the capacitor electrode 17 have their respective longitudinal extension. In a second lateral direction 31 the plurality devices 1 are arranged consecutive (only one device being shown in detail in FIG. 1). The insulating layer 15 comprises different sublayers 15a-c. The sublayer 15a on the frontside 8.1 of the semiconductor body 8 can for instance be a silicon nitride layer, covered by the sublayer 15b, e.g. a TEOS layer. The sublayer 15c covering the capacitor electrode 17 can for instance be a BPSG or TEOS layer. The sublayer 15b forms a lower dielectric spacer 28 embedding the capacitor electrode 17 downwards, the sublayer 15c forms the upper dielectric spacer 18, see FIG. 1 in comparison.

Figure 3:
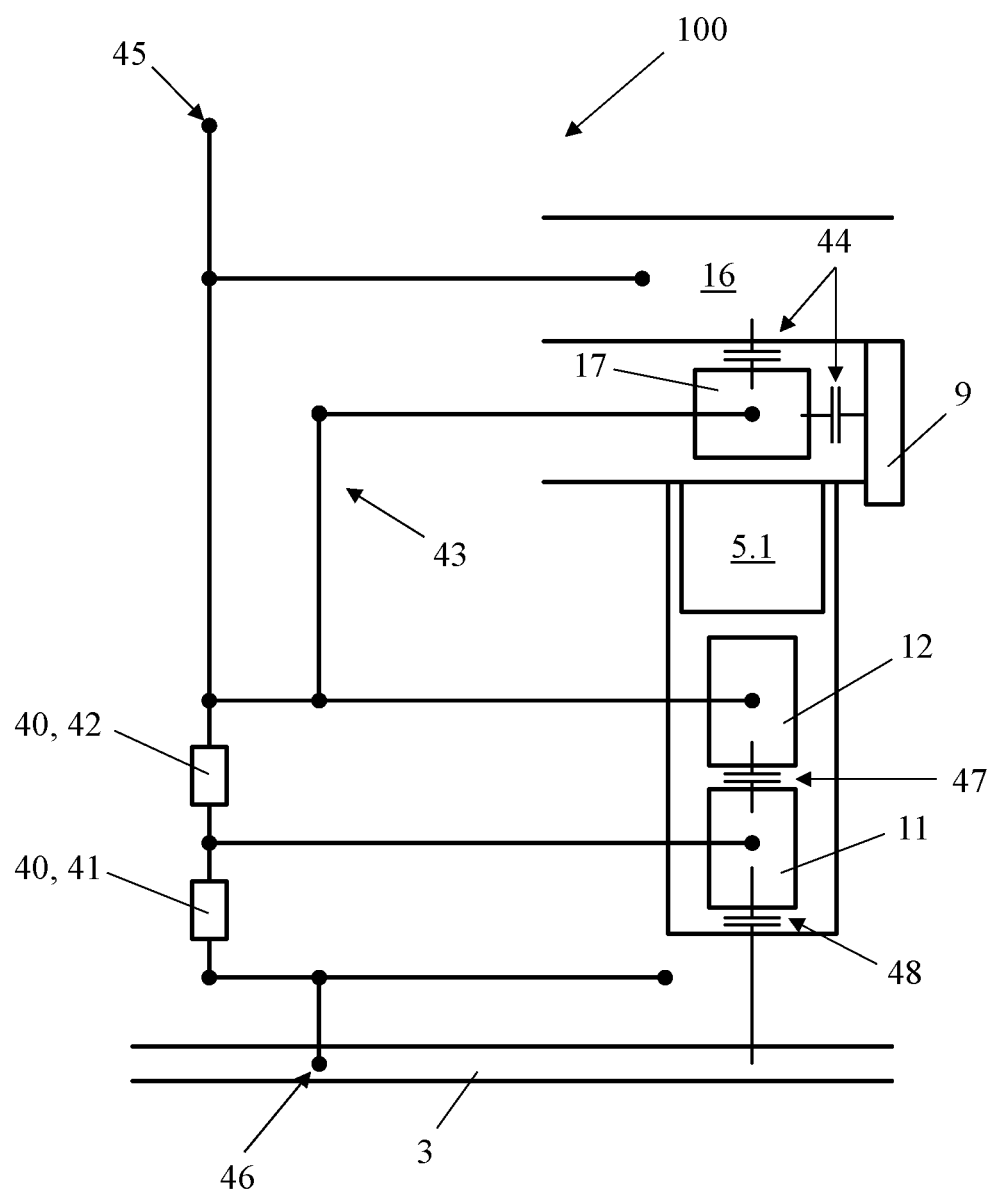
FIG. 3 illustrates a wiring of field electrode structures of the devices of FIGS. 1 and 2 with schematically shown resistors integrated into the die.

FIG. 3 illustrates the wiring of the field electrode structures 11, 12 and the capacitor electrode 17. The second field electrode structure 12 is on source potential 45, like the frontside metallization 16. The first field electrode structure 11 is conductively connected 43 to the capacitor electrode 17, which forms capacities 44 with the frontside metallization 16 and the vertical interconnects 9, the metallization and interconnect being on source potential 45. These additional capacities 44 add to a capacity 47 between the first and the second field electrode structure 11, 12, the former being on source potential 45 as well.

With the capacitive voltage divider discussed so far, a desired voltage drop can be obtained under fast switching conditions. In addition, a resistive voltage divider is realized by a chain of resistors 40. A first resistor 41 is connected in parallel with a capacitor 48 formed between the first field electrode structure 11 and the drain potential 46, and a second resistor 42 is connected in parallel with the capacitor 47 formed between the field electrode structures 11, 12. With the resistors 40, the desired voltage drop can be obtained under static or slow switching conditions. The resistors 40 and capacitors used for this RC-coupling are integrated into the semiconductor die 100.

Figure 4A:
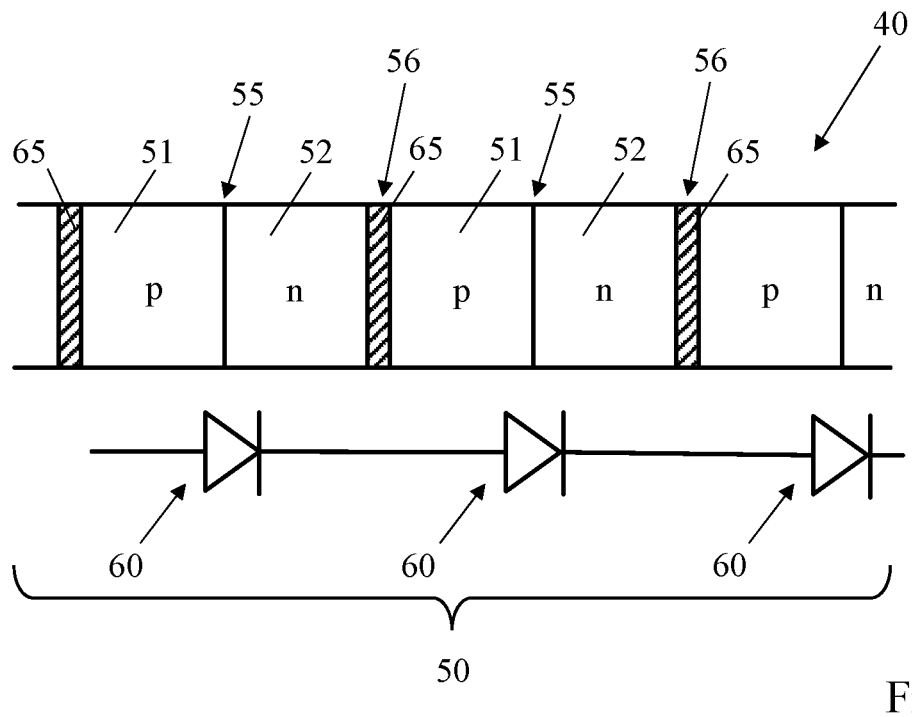
FIG. 4a illustrates a chain of diodes which can be used as a resistor for the wiring shown in FIG. 3.

FIG. 4a illustrates a possibility for forming a resistor 40 integrated into the semiconductor body 8, made of a chain 50 of diodes 60. This chain 50 is formed of alternating p-doped regions 51 and n-doped regions 52 formed adjacent each other. Between these regions 51, 52 pn-junctions 55 and np-junctions 56 are formed. Every second junction, in the example shown each np-junction 56, is electrically bridged by a conductive element 65. The latter can be made of metal, e.g. tungsten. The resulting chain 50 blocks only in one direction.

Figure 4B:
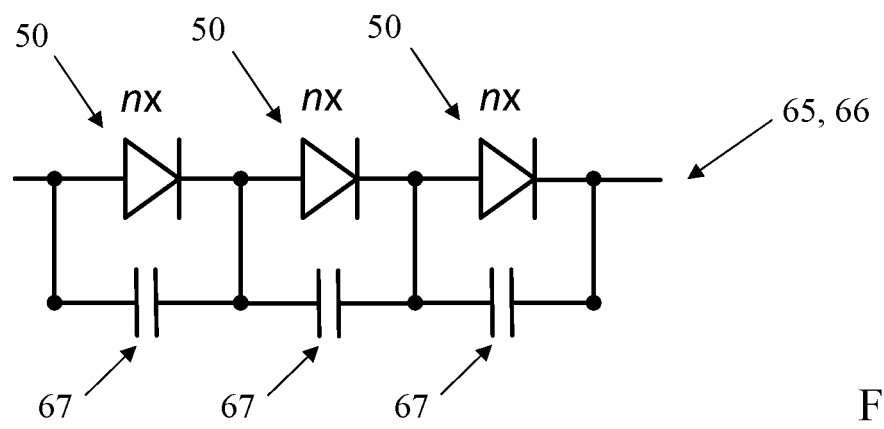
FIG. 4b shows a circuit diagram illustrating an RC-coupling of field electrode structures as integrated into the devices of FIGS. 1-3.

FIG. 4b illustrates in a schematic circuit diagrams 65 the capacitive and resistive voltage divider 66 formed by a plurality of diode chains 50 connected in series and a plurality capacitors 67, respectively connected in parallel.

Figure 5A:
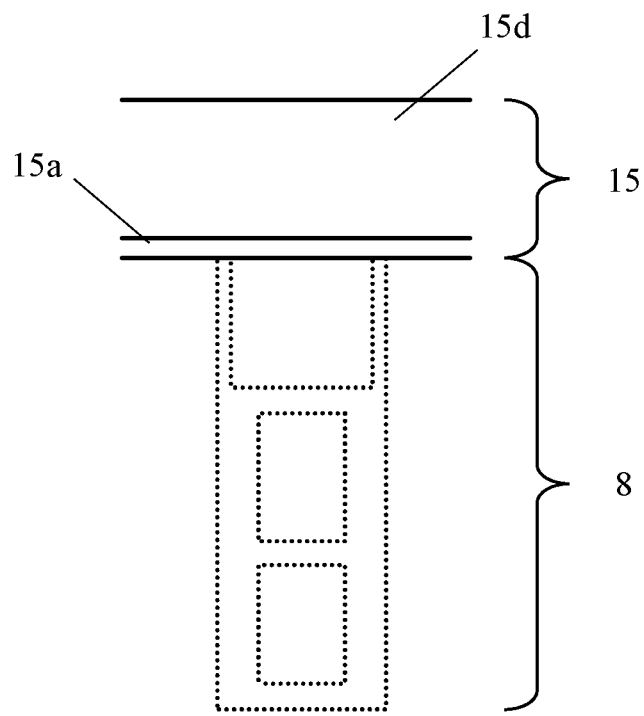
FIGS. 5a-c illustrate some manufacturing steps.
Figure 5B:
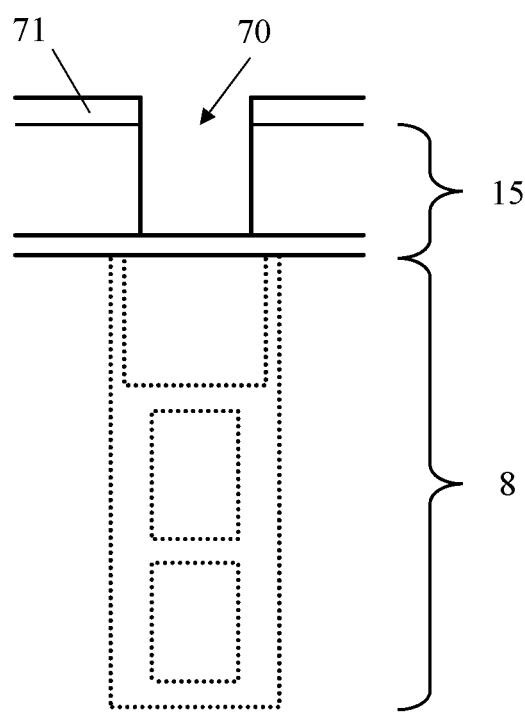
Figure 5C:
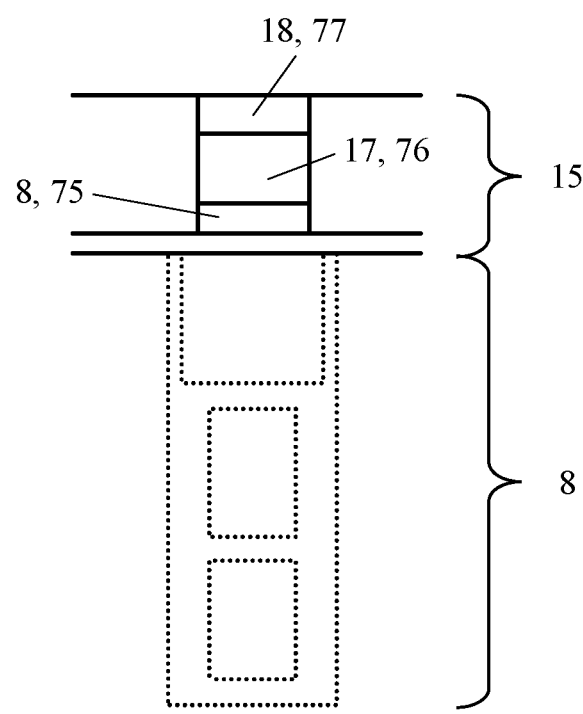

FIG. 5a-c illustrate some manufacturing steps for forming the capacitor electrode 17 integrated into the insulating layer 15. In FIG. 5a, the insulating layer 15 has been formed on the semiconductor body 8, e.g. by a subsequent deposition of different sublayers 15a, d, e.g. a silicon nitride layer and a TEOS layer on top. Prior to the steps shown in FIG. 5a, the field electrode trench 7 with the field electrode 10 and the gate region 5 has been formed.

In the process step shown in FIG. 5b, a recess 70 has been etched into the insulating layer 15, with an etch stop on the sublayer 15a. Before, a mask 71 has been deposited and structured on the insulating layer 15 to define the recess etch. FIG. 5c illustrates the filled recess 70, namely after a deposition of insulating layer material 75 to form the lower dielectric spacer 8, a deposition of capacitor electrode material 76 to form the capacitor electrode 17, and a deposition of insulating layer material 77 to form the upper dielectric spacer 18. After a respective deposition process, excess material can be removed, e.g. by an etchback step. After the process step shown in FIG. 5c, the vertical interconnects 12 can be formed (not shown), the frontside metallization 16 being deposited subsequently.

Figure 6:
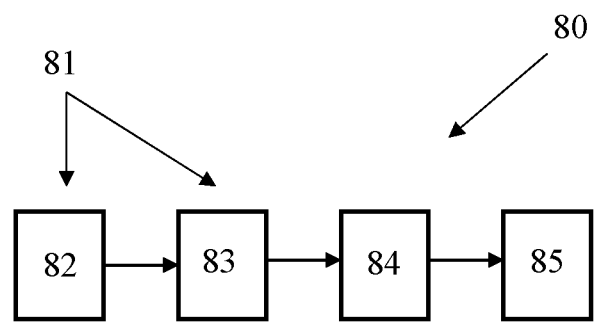
FIG. 6 summarizes some manufacturing steps in a flow diagram.

FIG. 6 shows a flow diagram 80 summarizing some processing steps 81. After forming 82 the field electrode trench 7, the field electrode 10 and the gate region 5, the insulating layer 15 can be formed 83. Subsequently, the recess 70 can be etched 84 into the insulating layer 15, prior to forming 85 the capacitor electrode 17 in the recess 70.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor die comprising a transistor device, the transistor device having:
a channel region formed in a semiconductor body;
a gate region aside the channel region and configured to control a channel formation;
a drift region formed in the semiconductor body; and
a field electrode in a field electrode trench,
wherein the field electrode trench extends from a frontside of the semiconductor body vertically into the drift region,
wherein an insulating layer is formed on the frontside of the semiconductor body and a frontside metallization is formed on the insulating layer,
wherein a capacitor electrode formed in the insulating layer is conductively connected to at least a portion of the field electrode.

2. The semiconductor die of claim 1, wherein the field electrode comprises a first and a second field electrode structure, wherein the first field electrode structure is capacitively coupled to a first section of the drift region, wherein the second field electrode structure is capacitively coupled to a second section of the drift region, and wherein the second section is arranged vertically above the first section.

3. The semiconductor die of claim 2, wherein the capacitor electrode formed in the insulating layer is conductively connected to the first field electrode structure, and wherein the first field electrode structure is a lowermost field electrode structure in the field electrode trench.

4. The semiconductor die of claim 3, wherein a capacity value between the first field electrode structure and a source potential is set to a capacity value between the first field electrode structure and a drain potential.

5. The semiconductor die of claim 1, wherein in a vertical cross-section, the capacitor electrode is arranged vertically above a gate electrode of the gate region.

6. The semiconductor die of claim 1, wherein a vertical interconnect extends through the insulating layer and conductively connects the frontside metallization to a source region of the transistor device, and wherein the capacitor electrode is capacitively coupled to the vertical interconnect.

7. The semiconductor die of claim 1, wherein the frontside metallization extends above the capacitor electrode and is separated from the capacitor electrode by an upper dielectric spacer, and wherein the capacitor electrode is capacitively coupled to the frontside metallization.

8. The semiconductor die of claim 1, wherein the field electrode and the field electrode trench have a longitudinal extension in a first lateral direction, and wherein the capacitor electrode has a longitudinal extension in the first lateral direction, in parallel to the field electrode.

9. The semiconductor die of claim 1, wherein the semiconductor die comprises a plurality of transistor devices which are arranged consecutive in a second lateral direction, and wherein in a vertical cross-section, capacitor electrodes of the plurality transistor devices are separated from each other by portions of the insulating layer.

10. The semiconductor die of claim 1, further comprising a second insulating layer formed on the semiconductor body in a edge region, wherein the second insulating layer differs from the insulating layer in which the capacitor electrode is formed in at least one of a layer thickness and a layer material.

11. The semiconductor die of claim 1, further comprising a resistor connected in parallel with a capacitor formed by the field electrode, the resistor formed by a chain of diodes.

12. The semiconductor die of claim 11, wherein the field electrode comprises a first and a second field electrode structure, wherein the first field electrode structure is capacitively coupled to a first section of the drift region, wherein the second field electrode structure is capacitively coupled to a second section of the drift region, and wherein the second section is arranged vertically above the first section, wherein the resistor is connected in parallel with a first capacitor formed by the first field electrode structure and a drain potential, or connected in parallel with a second capacitor formed by the second field electrode structure and the first field electrode structure.

13. The semiconductor die of claim 11, wherein the chain of diodes is formed of a plurality p-doped regions and a plurality n-doped regions, the p- and n-doped regions arranged alternately forming alternating pn- and np-junctions, and wherein the pn-junctions or the np-junctions are electrically bridged.

14. A method of manufacturing a semiconductor die having a transistor device that includes a channel region formed in a semiconductor body, a gate region aside the channel region and configured to control a channel formation, a drift region formed in the semiconductor body, and a field electrode in a field electrode trench, wherein the field electrode trench extends from a frontside of the semiconductor body vertically into the drift region, the method comprising:
 forming an insulating layer on the frontside of the semiconductor body;
 forming a frontside metallization on the insulating layer; and
 forming a capacitor electrode in the insulating layer and that is conductively connected to at least a portion of the field electrode.

* * * * *

UNITED STATES PATENT AND TRADEMARK OFFICE
CERTIFICATE OF CORRECTION

| | |
|---|---|
| PATENT NO. | : 12,107,152 B2 |
| APPLICATION NO. | : 17/682113 |
| DATED | : October 1, 2024 |
| INVENTOR(S) | : S. Tegen et al. |

It is certified that error appears in the above-identified patent and that said Letters Patent is hereby corrected as shown below:

In the Claims

Column 10, Line 58 (Claim 13, Line 2), please change "plurality" to -- plurality of --.

Column 10, Line 59 (Claim 13, Line 3), please change "plurality" to -- plurality of --.

Signed and Sealed this
Tenth Day of December, 2024

*Katherine Kelly Vidal*

Katherine Kelly Vidal
*Director of the United States Patent and Trademark Office*